United States Patent

Ono

(10) Patent No.: US 10,068,750 B2
(45) Date of Patent: Sep. 4, 2018

(54) BLANKING APERTURE ARRAY APPARATUS, CHARGED PARTICLE BEAM LITHOGRAPHY APPARATUS, AND ELECTRODE TESTING METHOD

(71) Applicant: NUFLARE TECHNOLOGY, INC., Yokohama-shi (JP)

(72) Inventor: Masayoshi Ono, Sagamihara (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/699,231

(22) Filed: Sep. 8, 2017

(65) Prior Publication Data

US 2018/0076006 A1 Mar. 15, 2018

(30) Foreign Application Priority Data

Sep. 9, 2016 (JP) .................................. 2016-176933

(51) Int. Cl.
*H01J 37/304* (2006.01)
*H01J 37/317* (2006.01)

(52) U.S. Cl.
CPC ........ *H01J 37/304* (2013.01); *H01J 37/3177* (2013.01); *H01J 2237/31777* (2013.01); *H01J 2237/31798* (2013.01)

(58) Field of Classification Search
USPC .................. 250/396 R, 398, 492.22, 492.23
See application file for complete search history.

(56) References Cited

U.S. PATENT DOCUMENTS

| 5,528,048 | A | * | 6/1996 | Oae | B82Y 10/00 250/492.2 |
| 5,841,145 | A | * | 11/1998 | Satoh | H01J 37/3023 250/492.22 |
| 5,910,658 | A | * | 6/1999 | Arai | B82Y 10/00 250/398 |
| 2017/0133199 | A1 | * | 5/2017 | Lee | H01J 37/3177 |

FOREIGN PATENT DOCUMENTS

| JP | 2006-19438 | 1/2006 |
| JP | 2013-128031 | 6/2013 |
| JP | 2013-128032 | 6/2013 |
| JP | 2013-197469 | 9/2013 |
| JP | 2015-70213 | 4/2015 |
| JP | 2016-54291 | 4/2016 |

* cited by examiner

*Primary Examiner* — Kiet T Nguyen
(74) *Attorney, Agent, or Firm* — Oblon, McClelland, Maier & Neustadt, L.L.P.

(57) ABSTRACT

In one embodiment, a BAA apparatus 204 includes apertures 3, each of which being provided to blank charged particle beams 20. The apparatus 204 further includes first electrodes 6a, second electrodes 6b, first via plugs 5a, second via plugs 5c, drivers 2 and comparison circuitries 7 that are provided for each aperture 3, wherein a first electrode 6a and a second electrode 6b are opposite to each other, first and second via plug 5a and 5c are electrically connected to the first electrode 6a, a driver 2 supplies a driving signal to the first electrode 6a via the first via plug 5a, and a comparison circuitry 7 is provided to correspond to the first electrode 6a and compares the driving signal and a signal obtained from the second via 5c plug to output a comparison result signal indicating a result of the comparison.

13 Claims, 10 Drawing Sheets

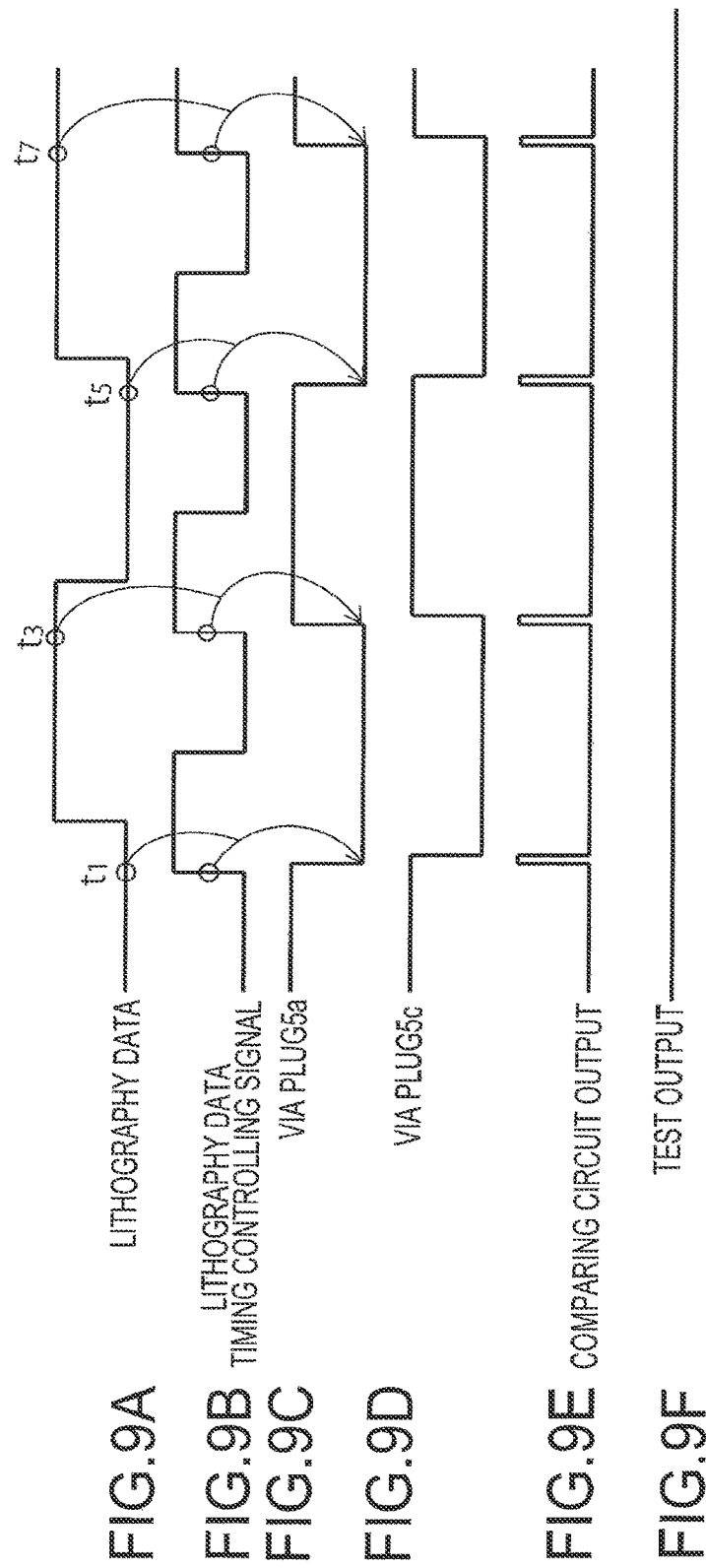

BLANKING APERTURE ARRAY APPARATUS, CHARGED PARTICLE BEAM LITHOGRAPHY APPARATUS, AND ELECTRODE TESTING METHOD

CROSS REFERENCE TO RELATED APPLICATION

This application is based upon and claims the benefit of priority from the prior Japanese Patent Application No. 2016-176933, filed on Sep. 9, 2016, the entire contents of which are incorporated herein by reference.

FIELD

Embodiments described herein relate to a blanking aperture array apparatus, a charged particle beam lithography apparatus, and an electrode testing method.

BACKGROUND

Circuit line widths required for semiconductor devices are yearly becoming finer with higher integration of the semiconductor devices. In order to form a desired circuit pattern in a semiconductor device, a high-precision original pattern is needed. Here, electron beam (EB) lithography technology has excellent resolution essentially and is used for production of high-precision original patterns.

For example, since an EB (electron beam) lithography apparatus in a multibeam lithography scheme can radiate many beams at once by using multibeams for lithography, throughput can be drastically improved as compared with the case of performing lithography with one electron beam. In such an EB lithography apparatus, for example, an electron beam released from an electron gun is caused to pass through a mask having a plurality of holes to form the multibeams, which beams are caused to pass through a blanking aperture array (BAA) apparatus. In this stage, the beams individually undergo deflection control by the BAA apparatus, and deflected beams are radiated onto a shield to be shielded (blanked). Beams not deflected are radiated onto a sample. The beams not deflected undergo deflection control by a separate deflector from the BAA apparatus so as to be radiated to desired positions on the sample.

FIGS. 10A and 10B are schematic diagrams showing a configuration of a conventional BAA apparatus.

FIG. 10A shows a controlling circuit 1 that controls blanking operation of the BAA apparatus, driving circuits 2 that drive electrodes of the BAA apparatus, and apertures 3 for causing electron beams to pass through. As shown in FIG. 10A, the BAA apparatus includes an aperture array having the plurality of apertures 3. The aperture array in FIG. 10A has m×n apertures 3 arranged into an array (m and n are positive integers). The BAA apparatus is constituted of a semiconductor chip (BAA chip).

FIG. 10B shows a pattern structure of an electrode portion of one aperture 3 constituting the aperture array as seen from the above. Specifically, FIG. 10B shows lines 4a and 4b, via plugs 5a and 5b, and electrodes 6a and 6b which are provided near this aperture 3. The electrode 6a is a deflecting electrode for deflecting an electron beam passing through this aperture 3. The electrode 6b is a ground electrode to which a ground (GND) potential is applied. Hereafter, the electrode 6a is expressed as a "deflecting electrode" for convenience, and the electrode 6b is expressed as a "ground electrode" for convenience. The electrode 6a is also referred to as a blanking electrode, the electrode 6b is also referred to as an earth electrode.

In this BAA apparatus, the controlling circuits 1 and the driving circuits 2 are manufactured through a semiconductor manufacturing process. Meanwhile, the aperture array is generally manufactured through a MEMS (Micro Electro Mechanical Systems) manufacturing process since the electrode portion, that is, a portion of the electrode 6a and the electrode 6b is needed to be thick.

The controlling circuit 1 is constituted of a receiving circuit for receiving lithography data transferred from a calculator system at high speed, a delivering circuit that delivers the received data for deflection control at each aperture 3, and the like. The driving circuit 2 is constituted of a level converting circuit that converts an internal voltage level of an LSI (Large Scale Integrated circuit) into a voltage level needed for deflecting an electron beam by the deflecting electrode 6a, a buffer circuit that outputs a driving signal having the converted voltage level to actually drive the deflecting electrode 6a, and the like. The controlling circuit 1 and the driving circuits 2 manufactured through the semiconductor manufacturing process are tested, for example, by a scanning test circuit in the shipping test step of the LSI.

The deflecting electrode 6a is used for applying a voltage for deflection control of the electron beam. The aperture 3 is a hole formed in a semiconductor substrate such that the electron beam can pass through, and sandwiching the aperture 3, the deflecting electrode 6a and the ground electrode 6b which are MEMS electrodes are arranged. The deflecting electrode 6a is connected to the output of the driving circuit 2 at the lower layer via the via plug 5a and the line 4a. Meanwhile, the ground electrode 6b is connected to the ground potential via the via plug 5b and the line 4b. Examples of the lines 4a and 4b are metal lines such as aluminum lines.

In blanking, a voltage is applied between the deflecting electrode 6a and the ground electrode 6b, and the electron beam is deflected with an electric field generated in this way. To the deflecting electrode 6a, the voltage of the driving circuit 2 is only electrically applied, and it does not drive any other circuits. Therefore, in order to test the deflecting electrode 6a, direct contact with the deflecting electrode 6a is needed. However, since the size of the deflecting electrode 6a, which is tens of nanometers, is small, such direct contact with the deflecting electrode 6a for testing the deflecting electrode 6a is difficult.

Therefore, in inspection of the deflecting electrodes 6a, it is visually confirmed at the end of the MEMS process that the deflecting electrodes 6a are not peeled off, or it is tested whether the lines 4a and 4b make a short by measuring a current flowing between the lines 4a and 4b with the deflecting electrode 6a driven. However, this inspection cannot detect a failure in which the deflecting electrode 6a is open. Therefore, such an open failure of the deflecting electrode 6a is determined by implementing the BAA apparatus on a printed circuit board and actually mounting this board on an EB lithography apparatus to confirm whether the EB lithography apparatus can properly control electron beams.

BRIEF DESCRIPTION OF THE DRAWINGS

FIGS. 9A to 9F show a timing chart for explaining operation in the second example of the test outputting circuit of the present embodiment.

DETAILED DESCRIPTION

Figure 1:
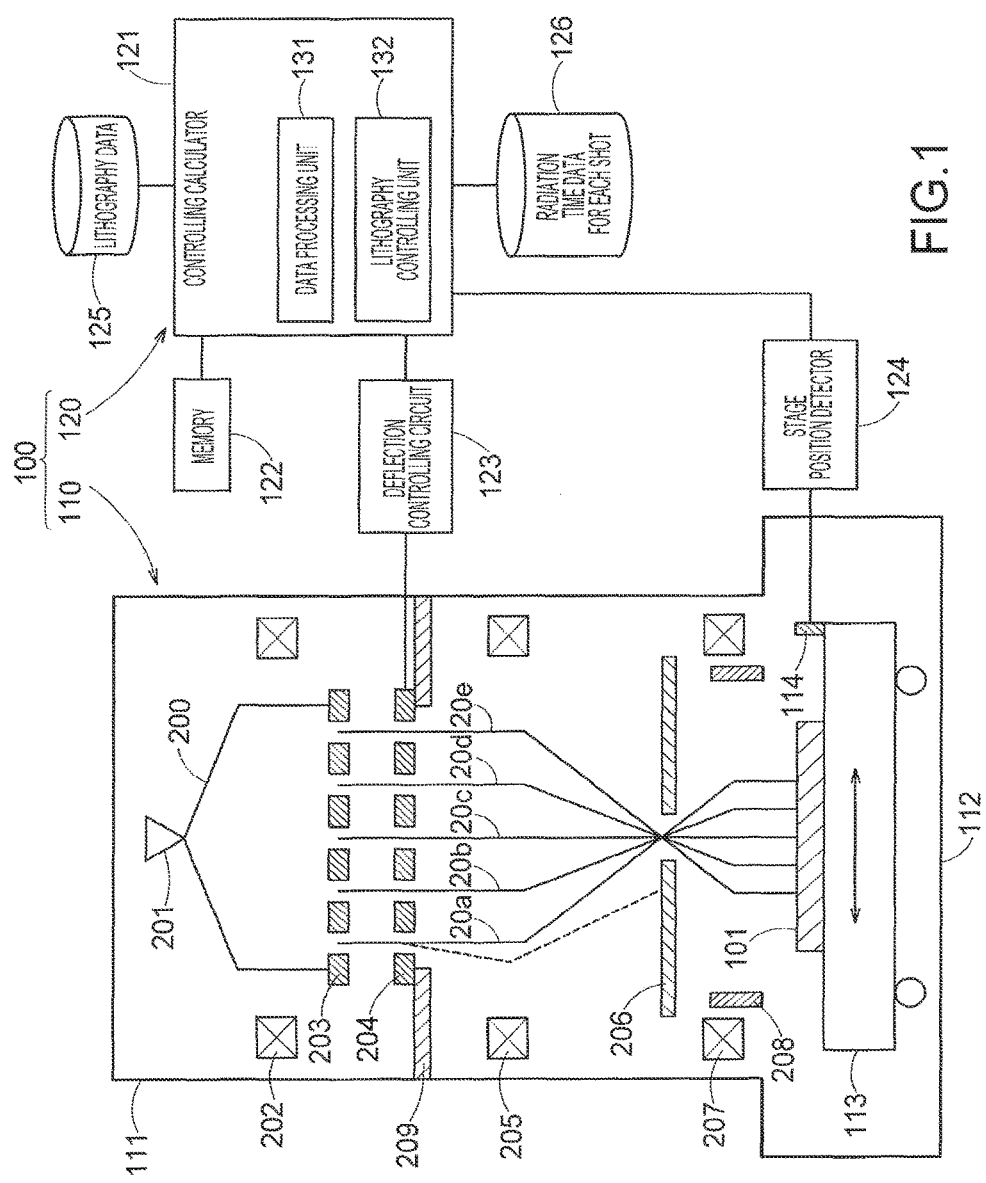
FIG. 1 is a schematic diagram showing a configuration of an EB lithography apparatus of an embodiment.

Embodiments will now be explained with reference to the accompanying drawings.

When there exists a failure beam that cannot be controlled due to a failure of the electrode 6a in electron beams passing through the apertures 3 of the BAA apparatus, there is a method of performing lithography without using the failure beam not to decrease precision. Further, as a failure beam detecting step used in this lithography method, there is known a method of moving an XY stage to the position where an electron beam is projected and detecting a current with a Faraday cup to test the electron beam to be defective or not.

In this way, when testing an electrode portion using an EB lithography apparatus, in the case of few electrodes 6a of the BAA apparatus, a test time is not very long. However, the test time problematically becomes longer when the number of the apertures 3 (the number of the electrodes 6a) of the BAA apparatus is going to increase up to tens of thousands or more hereafter in order to improve throughput of lithography processing of the EB lithography apparatus.

Moreover, such an increased number of electrodes 6a results in an increased number of failure beams, which takes a longer time for analyzing failures and influence of failure occurrence increases. Since the aforementioned method of performing lithography without using a failure beam not to decrease precision performs lithography at the position of the failure beam using a proximity effect of a beam near the failure beam, this lithography method reaches its limitation in the case of further more failure beams, which causes difficulty of normal lithography. In this case, the entirety of a substrate on which the BAA chip (BAA apparatus) is mounted becomes not able to be used, and the entirety of the substrate is needed to be replaced as a defective article, which is economically problematic. Therefore, a testing method is needed which can easily and completely test the electrodes 6a and can specify a failure place in the BAA apparatus.

Moreover, to specify a place of a failure beam using an EB lithography apparatus is often performed in periodic inspections typically performed every several months. However, when the electrode 6a is peeled off during use of the EB lithography apparatus after a periodic inspection, since the beam with this peeled-off electrode 6a is not recognized as a failure beam, a pattern error arises in a mask having been lithographed.

The main cause of peeling-off of the electrode 6a during use of the EB lithography apparatus is considered to be that a warp arises in the BAA chip due to difference in coefficient of thermal expansion between the chip and the substrate when implementing the BAA chip on the substrate, and the warp of the chip causes stress on the electrode 6a.

Since BAA chips that are going to be developed afterward are to have tens of thousands or more of apertures 3 in order to improve their throughputs, the chip size thereof tends to increase. The increased chip size leads to a larger warp of the chip due to the difference in coefficient of thermal expansion, which causes the electrode 6a to be more easily peeled off. Since there can be considered many kinds of cause of the pattern error when the electrode 6a is peeled off during use of the EB lithography apparatus and the pattern error arises, to specify the cause takes time, and during the time, the EB lithography apparatus cannot be used. Therefore, means that can detect peeling-off of an electrode 6a during use of an EB lithography apparatus is needed.

In one embodiment, a blanking aperture array apparatus includes a plurality of apertures arranged into an array, each of which being provided to blank a plurality of charged particle beams. The apparatus further includes first electrodes, second electrodes, first via plugs, second via plugs, drivers and comparison circuitries that are provided for each of the plurality of apertures, wherein a first electrode performs blanking control, a second electrode is opposite to the first electrode and connected to a ground, a first via plug is electrically connected to the first electrode, a second via plug is electrically connected to the first electrode, a driver supplies a driving signal that drives the first electrode to the first electrode via the first via plug, and a comparison circuitry is provided to correspond to the first electrode and compares the driving signal and a signal obtained from the second via plug to output a comparison result signal indicating a result of the comparison.

Preferably, the apparatus further includes a compressor that compresses, under division of the plurality of apertures into a plurality of blocks, outputs of comparison result signals from the comparison circuitries for each block, and outputs a compression result signal indicating a result of the compression.

Preferably, the apparatus further includes a first compressor that compresses, under division of the plurality of apertures into a plurality of blocks, outputs of comparison result signals from the comparison circuitries for each block, and outputs a first compression result signal indicating a result of the compression, and a second compressor that compresses the first compression result signals for the plurality of blocks, and outputs a second compression result signal indicating a result of the compression.

More preferably, the comparison result signal indicates a calculation result of an exclusive OR of a logic level of the driving signal and a logic level of the signal obtained from the second via plug.

More preferably, the driver masks a predetermined pulse of the comparison result signal caused by phase difference between the driving signal and the signal obtained from the second via plug.

In another embodiment, a charged particle beam lithography apparatus includes a plurality of apertures arranged into an array, each of which being provided to blank a plurality of charged particle beams. The apparatus further includes first electrodes, second electrodes, first via plugs, second via plugs, drivers and comparison circuitries that are provided for each of the plurality of apertures, wherein a first electrode performs blanking control, a second electrode is opposite to the first electrode and connected to a ground, a first via plug is electrically connected to the first electrode, a second via plug is electrically connected to the first electrode, a driver supplies a driving signal that drives the first electrode to the first electrode via the first via plug, and a comparison circuitry is provided to correspond to the first electrode and compares the driving signal and a signal obtained from the second via plug to output a comparison result signal indicating a result of the comparison. The apparatus further includes a controller that controls lithography with the charged particle beams based on the comparison result signal.

In another embodiment, an electrode testing method is performed for a blanking aperture array apparatus that includes a plurality of apertures arranged into an array, each of which being provided to blank a plurality of charged particle beams, and first electrodes, second electrodes, first via plugs, second via plugs, drivers and comparison circuitries that are provided for each of the plurality of apertures. The method includes supplying a driving signal that drives a first electrode from a driver to the first electrode via a first via plug that is electrically connected to the first electrode. The method further includes comparing, by a comparison circuitry provided to correspond to the first electrode, the driving signal and a signal obtained from a second via plug that is electrically connected to the first electrode to output a comparison result signal indicating a result of the comparison. The method further includes determining whether the blanking aperture array apparatus is defective based on the comparison result signal.

Preferably, the method is performed without mounting the blanking aperture array apparatus on a charged particle beam lithography apparatus.

FIG. 1 is a schematic diagram showing a configuration of an EB lithography apparatus 100 of an embodiment. The EB lithography apparatus 100 in a multibeam lithography scheme shown in FIG. 1 is an example of a charged particle beam lithography apparatus, and includes a lithography unit 110 and a controlling unit 120.

The lithography unit 110 includes an electron barrel 111, a lithography chamber 112, an XY stage 113 and a mirror 114, and in the electron barrel 111, includes an electron gun 201, an illumination lens 202, an aperture member 203, a BAA apparatus 204, a reducing lens 205, a limiting aperture member 206, an objective lens 207, a deflector 208 and a blanking aperture stage apparatus 209. The BAA apparatus 204 in FIG. 1 is a semiconductor chip (BAA chip) implemented on a substrate, and this substrate is placed on the blanking aperture stage apparatus 209.

Moreover, the controlling unit 120 includes a controlling calculator 121, a memory 122, a deflection controlling circuit 123, a stage position detector 124, storages 125 and 126, and a bus connecting these to one another. The controlling calculator 121 is an example of a controller. In the storage 125, lithography data is stored, and in the storage 126, radiation time data for each shot is stored.

The controlling calculator 121 includes a data processing unit 131 that performs information processing on various data, and a lithography controlling unit 132 that controls lithography operation of the EB lithography apparatus 100. The data processing unit 131 and the lithography controlling unit 132 may be realized by an electric circuit, or may be realized by executing a computer program on a processor. Input and output information and information being calculated in the data processing unit 131 and the lithography controlling unit 132 are stored in the memory on each occasion.

The EB lithography apparatus 100 radiates an electron beam 200 released from the electron gun 201 onto the aperture member 203 having a plurality of holes via the illumination lens 202. The electron beam 200 is an example of a charged particle beam. The electron beam 200 passing through these holes forms multibeams 20a to 20e. Hereafter, each of the multibeams 20a to 20e is expressed as a "beam 20" for convenience.

Furthermore, the EB lithography apparatus 100 causes each beam 20 to pass through the BAA apparatus 204. In this stage, the beams 20 individually undergo deflection control by the BAA apparatus 204, the deflected beams 20 are radiated onto the limiting aperture member 206 to be shielded (blanked). This deflection control is performed by the controlling calculator 121 through the deflection controlling circuit 123. In FIG. 1, the beam 20 indicated by sign 20a is radiated onto the limiting aperture member 206.

Meanwhile, the beams 20 not deflected by the BAA apparatus 204 are radiated onto a sample 101 placed on the XY stage 113 via the reducing lens 205, the limiting aperture member 206 and the objective lens 207. An example of the sample 101 is a mask blank, an exposing mask, a semiconductor substrate or the like. In FIG. 1, the beams 20 indicated by signs 20b to 20d are radiated onto the sample 101.

The beams 20 not deflected by the BAA apparatus 204 undergo deflection control by the deflector 208 so as to be radiated to desired positions on the sample 101.

Figure 2:
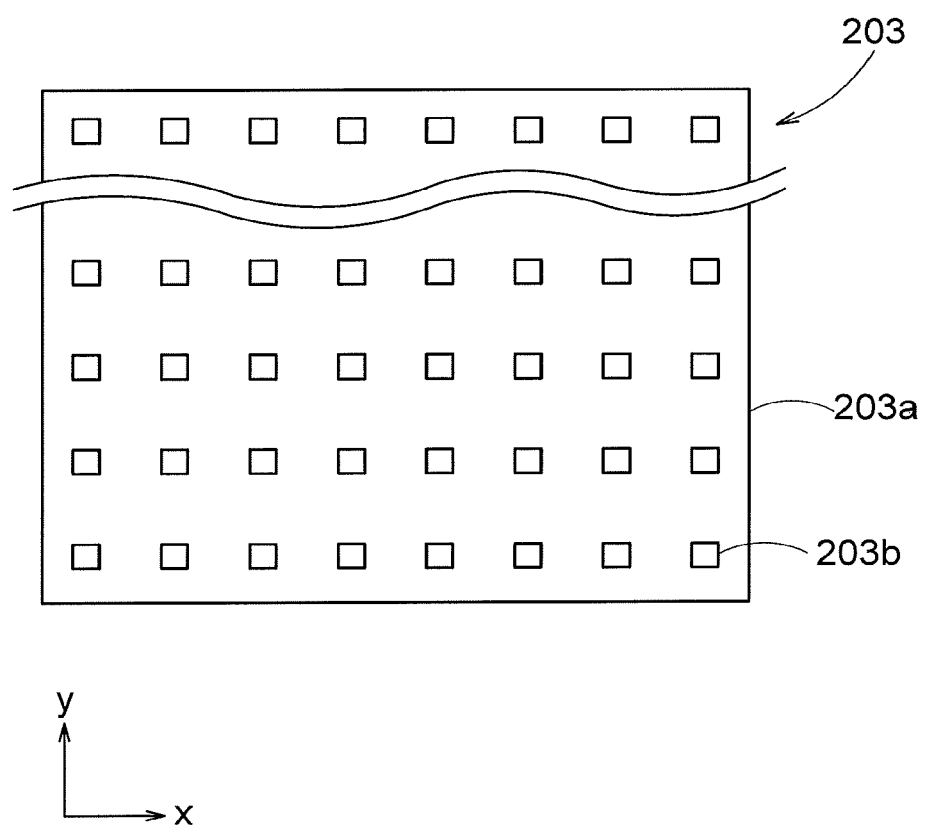
FIG. 2 is a schematic diagram showing a configuration of an aperture member of the present embodiment.

FIG. 2 is a schematic diagram showing a configuration of the aperture member 203 of the present embodiment.

In an example of FIG. 2, in a rectangular region 203a of the aperture member 203, holes (opening parts) 203b in m rows in the Y-direction and n rows in the X-direction are formed into a matrix at predetermined arrangement pitches. While the shape of these holes 203b is rectangular with the same size, the shape of these is not limited to the rectangle but may be, for example, circular with the same radius. A part of the electron beam 200 passing through these holes 203b is to form the multibeams 20a to 20e.

Figure 3A:
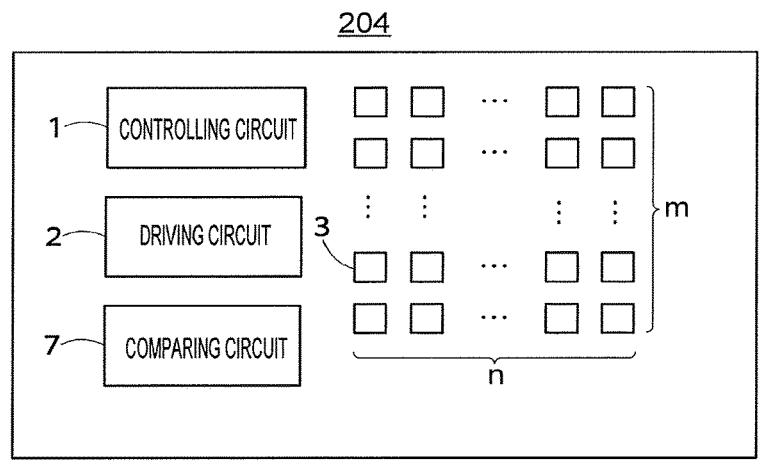
FIGS. 3A and 3B are schematic diagrams showing a configuration of a BAA apparatus of the present embodiment.
Figure 3B:
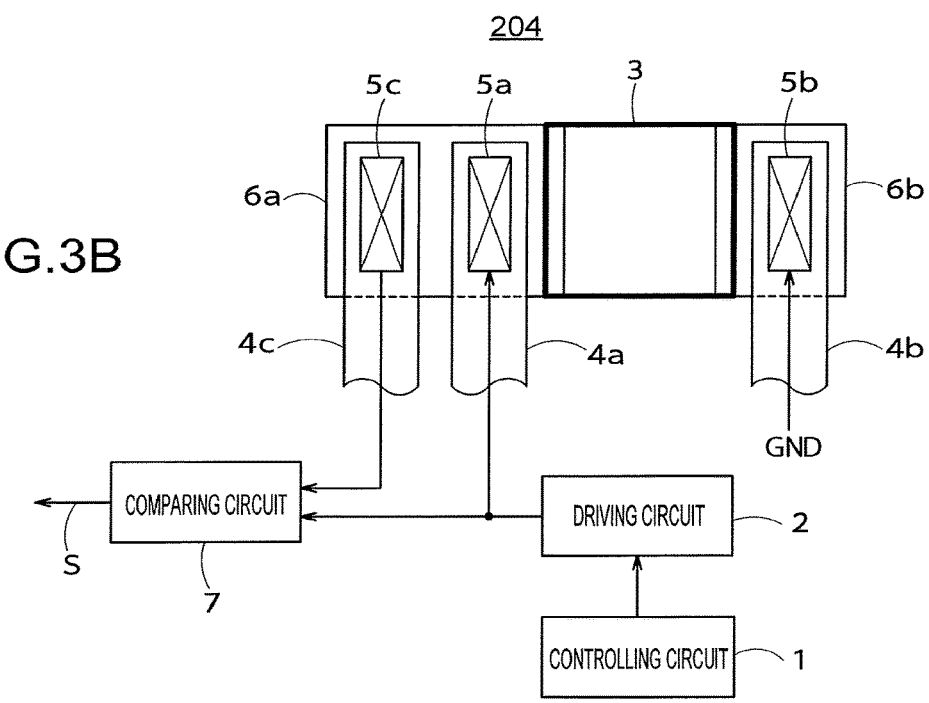

FIGS. 3A and 3B are schematic diagrams showing a configuration of the BAA apparatus 204 of the present embodiment.

Figure 10A:
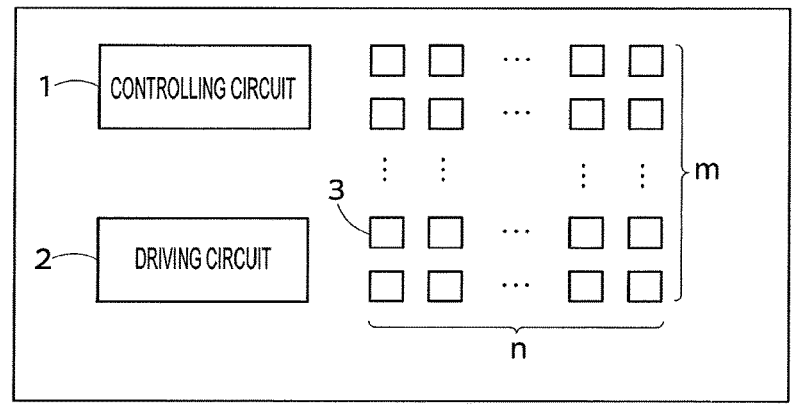
FIGS. 10A and 10B are schematic diagrams showing a configuration of a conventional BAA apparatus.

Similarly to FIG. 10A, FIG. 3A shows the controlling circuit 1 that controls blanking operation of the BAA apparatus 204, the driving circuits 2 that drive the electrodes of the BAA apparatus 204, and the apertures 3 for causing the electron beam 200 (multibeams 20a to 20e) to pass through. The driving circuits 2 are an example of drivers. As shown in FIG. 3A, the BAA apparatus 204 includes an aperture array having the plurality of apertures 3. The aperture array in FIG. 3A has m×n apertures 3 arranged into an array. In this way, the BAA apparatus 204 has the same number of apertures 3 as that of the holes 203b of the aperture member 203.

FIG. 3A further shows comparing circuits 7 which are an example of comparison circuitries. The BAA apparatus 204 of the present embodiment includes the same number of comparing circuits 7 as that of the apertures 3, and each comparing circuit 7 corresponds to one aperture 3. Likewise, the BAA apparatus 204 of the present embodiment includes the same number of driving circuits 2 as that of the apertures 3, and each driving circuit 2 corresponds to one aperture 3. Details of the comparing circuits 7 are mentioned later.

Figure 10B:
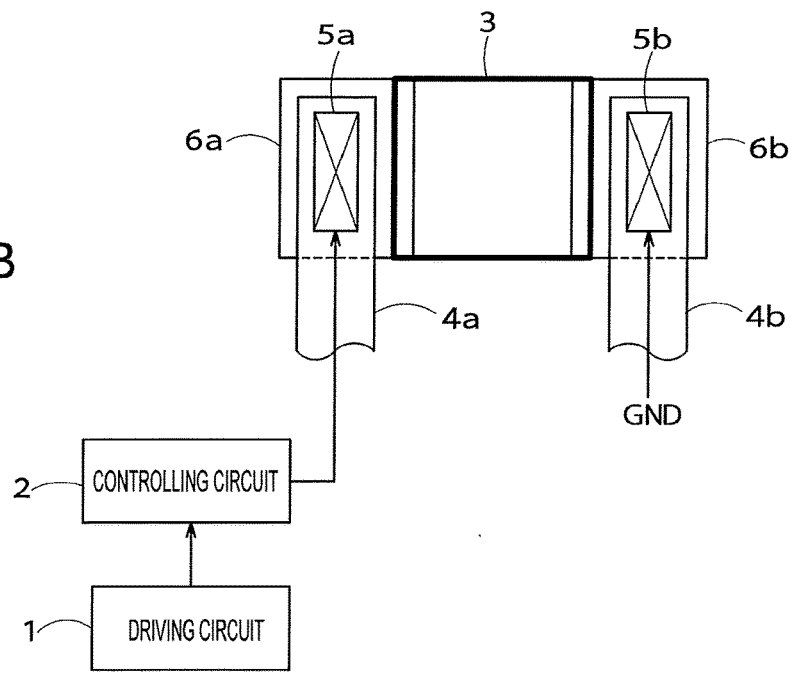

Similarly to FIG. 10B, FIG. 3B shows a pattern structure of an electrode portion of one aperture 3 constituting the aperture array as seen from the above. Specifically, FIG. 3B shows lines 4a, 4b and 4c, via plugs 5a, 5b and 5c, and the electrodes 6a and 6b which are provided to this aperture 3. The via plugs 5a and 5c are examples of first and second via plugs, respectively. Moreover, the electrodes 6a and 6b are examples of first and second electrodes, respectively.

The electrode 6a is a deflecting electrode for deflecting the beam 20 passing through the aperture 3 shown in FIG. 3B. The electrode 6b is a ground electrode to which a ground (GND) potential is applied. The via plugs 5a and 5c are via plugs independent of each other, and electrically connected to the electrode 6a such that they are not in contact with each other. Meanwhile, the via plug 5b is electrically connected to the electrode 6b. Moreover, the lines 4a, 4b and 4c are electrically connected to the via plugs 5a, 5b and 5c, respectively. As mentioned above, the electrode 6a is expressed as a "deflecting electrode" for convenience, and the electrode 6b is expressed as a "ground electrode" for convenience.

In this BAA apparatus 204, the controlling circuit 1, the driving circuits 2 and the comparing circuits 7 are manufactured through a semiconductor manufacturing process. Meanwhile, the aperture array is desirable to be manufactured through a MEMS manufacturing process since the electrode portion, that is, a portion of the electrode 6a and the electrode 6b is needed to be thick.

Operation of the controlling circuit 1 and the driving circuits 2 is as mentioned above. The controlling circuit 1 delivers lithography data received from the controlling calculator 121 for deflection control in each aperture 3. The driving circuit 2 outputs a driving signal that drives the deflecting electrode 6a.

The driving signal has a voltage level needed for deflecting the beam 20 by the deflecting electrode 6a, and is supplied to the deflecting electrode 6a via the line 4a and the via plug 5a. The deflecting electrode 6a is used for applying a voltage for deflection control of the beam 20 passing through the aperture 3. When the driving signal is supplied to the deflecting electrode 6a from the driving circuit 2, the voltage is applied between the deflecting electrode 6a and the ground electrode 6b. An electric field thereby arising deflects the beam 20. The deflecting electrode 6a is connected to the output of the driving circuit 2 via the via plug 5a and the line 4a, and is connected to an input of the comparing circuit 7 via the via plug 5c and the line 4c. Meanwhile, the ground electrode 6b is connected to the ground potential via the via plug 5b and the line 4b.

The comparing circuit 7 compares the logic level of the driving signal output from the driving circuit 2 and the logic level of a signal obtained from the via plug 5c to output a comparison result signal S indicating the result of this comparison. The comparing circuit 7 may be used in an electrode test before containing the BAA apparatus 204 inside the EB lithography apparatus 100, and may be used in an electrode test in the state where the BAA apparatus 204 is contained inside the EB lithography apparatus 100. While the following description is made supposing the former electrode test, this is also applicable to the latter electrode test.

When testing the electrode 6a, a driving signal holding a test pattern is input to the electrode 6a from the driving circuit 2 via the via plug 5a. This driving signal is also input to the comparing circuit 7 from the line 4a between the driving circuit 2 and the via plug 5a.

Here, when the electrode 6a is normally formed, the same signal as this driving signal is input to the comparing circuit 7 from the electrode 6a via the via plug 5c and the line 4c. In this case, since the comparing circuit 7 receives the signals with the same logic levels from the line 4a and the line 4c, it outputs the comparison result signal S that has a logic level in the case where the logic levels of both signals coincide with each other.

For example, in the case where the comparing circuit 7 is composed of an exclusive OR (XOR), when the electrode 6a is normal, the comparing circuit 7 outputs "logical 0" indicating agreement of both signals. The reason is that when the driving signal from the line 4a is "logical 0", the signal from the line 4c also becomes "logical 0", and the output of the comparing circuit 7 becomes XOR (0,0)=0. Moreover, when the driving signal from the line 4a is "logical 1", the signal from the line 4c also becomes "logical 1", and the output of the comparing circuit 7 becomes XOR (1,1)=0.

On the other hand, when there is a failure, the comparing circuit 7 operates as mentioned later. When it is a simple short failure wherein the via plug 5a and the via plug 5c are normally formed, the failure can be rejected in a test step of the driving circuit through a typical scanning test or the like since the output of the driving circuit 2 produced through the semiconductor manufacturing process is connected to the deflecting electrode produced through the MEMS process. Accordingly, hereafter, as to the case where the via plug 5a is open, the case where the line 4c makes a short to VDD or GND and the case where it is open are described.

First, in the case where the via plug 5a is open and the electrode 6a makes a short to the VDD potential (power supply potential), when the driving signal from the line 4a is "logical 0", the comparing circuit 7 outputs "logical 1" indicating disagreement of both signals. The reason is that even if the driving signal from the line 4a becomes "logical 0", the signal from the line 4c is always "logical 1", and hence, the output of the comparing circuit 7 becomes XOR (0,1)=1. In the case where the via plug 5a is open and the electrode 6a makes a short to the VDD potential, when the driving signal from the line 4a is "logical 1", the comparing circuit 7 outputs "logical 0" indicating agreement of both signals.

Moreover, in the case where the via plug 5a is open and the electrode 6a makes a short to the GND potential (ground potential), when the driving signal from the line 4a is "logical 1", the comparing circuit 7 outputs "logical 1" indicating disagreement of both signals. The reason is that even if the driving signal from the line 4a becomes "logical 1", the signal from the line 4c is always "logical 0", and hence, the output of the comparing circuit 7 becomes XOR (1,0)=1. In the case where the via plug 5a is open and the electrode 6a makes a short to the GND potential, when the driving signal from the line 4a is "logical 0", the comparing circuit 7 outputs "logical 0" indicating agreement of both signals.

Moreover, when the electrode 6a is in the open state by reason of the via plug 5a not normally formed or for the similar reason, it is unclear whether the logic level of the signal from the line 4c is "logical 0" or "logical 1". However, similarly to the case where the electrode 6a makes a short to the VDD potential or the GND potential, the output of the comparing circuit 7 becomes "logical 1" when the driving signal from the line 4a is "logical 0" or "logical 1".

In this way, in the electrode test of the present embodiment, the driving signal holding a test pattern is input to the electrode 6a from the driving circuit 2, and the driving signal from the line 4a and the signal from the line 4c are input to the comparing circuit 7. Then, the comparing circuit 7 outputs the comparison result signal S indicating the calculation result of the exclusive OR of the logic levels of both signals.

Therefore, in the case where the electrode 6a is normal, the comparison result signal S becomes "logical 0" in any case where the driving signal is "logical 0" or "logical 1". On the other hand, in the case where the electrode 6a is in the short state or in the open state, when the driving signal is "logical 0" or "logical 1", the comparison result signal S becomes "logical 1", Therefore, according to the present embodiment, a failure of the electrode 6a in the case where the via plug 5a is open can be determined from the comparison result signal S.

Since the electrode test of the present embodiment uses the comparison result signal S from the comparing circuit 7, it can be performed even when the BAA apparatus 204 is not actually mounted on the EB lithography apparatus 100. Therefore, according to the present embodiment, to perform a beam test, which takes time, for each aperture 3 in the state where the BAA apparatus 204 is mounted on the EB lithography apparatus 100 can be prevented. The electrode test of the present embodiment can be applied to a test in shipping the BAA apparatus 204, and a failure of the electrode 6a can be detected during the test in shipping.

In the present embodiment, a BAA apparatus 204 in which a failure does not arise in any electrodes 6a is determined to be a non-defective article, and a BAA apparatus 204 in which a failure arises in any of the electrodes 6a is determined to be a defective article. This decision may be performed manually by a human based on the comparison result signal S, or may be automatically performed based on the comparison result signal S.

Moreover, the electrode test of the present embodiment may be performed before containing the BAA apparatus 204 inside the EB lithography apparatus 100, or may be performed in the state where the BAA apparatus 204 is contained inside the EB lithography apparatus 100. In the former case, for example, the comparison result signal S is detected by a tester and the tester determines whether the BAA apparatus 204 is defective or not. In the latter case, for example, the comparison result signal S is input to the controlling calculator 121 and the controlling calculator 121 determines whether the BAA apparatus 204 is defective or not. In this case, the controlling calculator 121 may stop lithography onto the sample 101 when the BAA apparatus 204 is detected to be defective before or during the EB lithography apparatus 100 operating.

In the electrode test of the present embodiment, it may be determined whether the BAA apparatus 204 is defective or not based on a compression result signal obtained by compressing the comparison result signals S from the plurality of comparing circuits 7 in place of the comparison result signals S from the individual comparing circuits 7. Details of the compression result signal are mentioned later.

Figure 4:
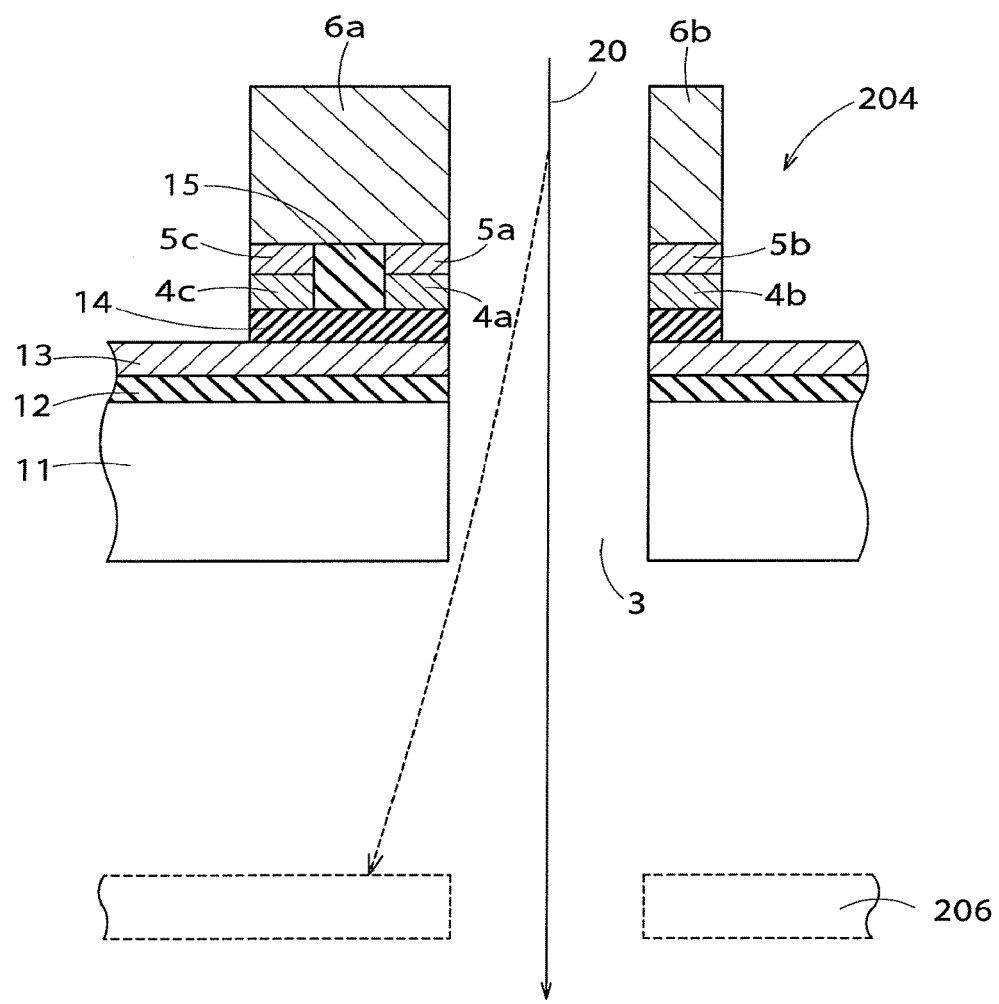
FIG. 4 is a cross-sectional view showing a configuration of the BAA apparatus of the present embodiment.

FIG. 4 is a cross-sectional view showing a configuration of the BAA apparatus 204 of the present embodiment.

As shown in FIG. 4, the BAA apparatus 204 includes a substrate 11, a conductor 13 formed on the substrate 11 via an insulator 12, and the lines 4a to 4c, the via plugs 5a to 5c and the electrodes 6a and 6b which are formed on the conductor 13 via an insulator 14. The line 4a and the via plug 5a are electrically insulated from the line 4c and the via plug 5c by an insulator 15.

An example of the substrate 11 is a semiconductor substrate such as a silicon substrate. FIG. 4 shows the aperture 3 formed so as to penetrate the substrate 11 and the like. The electrodes 6a and 6b are arranged so as to sandwich the aperture 3. The electrode 6a is formed on the line 4a via the via plug 5a and formed on the line 4c via the via plug 5c. Meanwhile, the electrode 6b is formed on the line 4b via the via plug 5b. FIG. 4 shows, by a dotted line, a trajectory on which the beam 20 passing through the aperture 3 is deflected by the electrode 6a and radiated onto the limiting aperture member 206.

As shown in FIG. 4, the electrode portion of the BAA apparatus 204, that is, the portion of the electrode 6a and the electrode 6b is formed to be thicker than the other portions. Therefore, the aperture array of the present embodiment is desirable to be manufactured through the MEMS manufacturing process, nevertheless, not limited to the MEMS manufacturing process.

Figure 5:
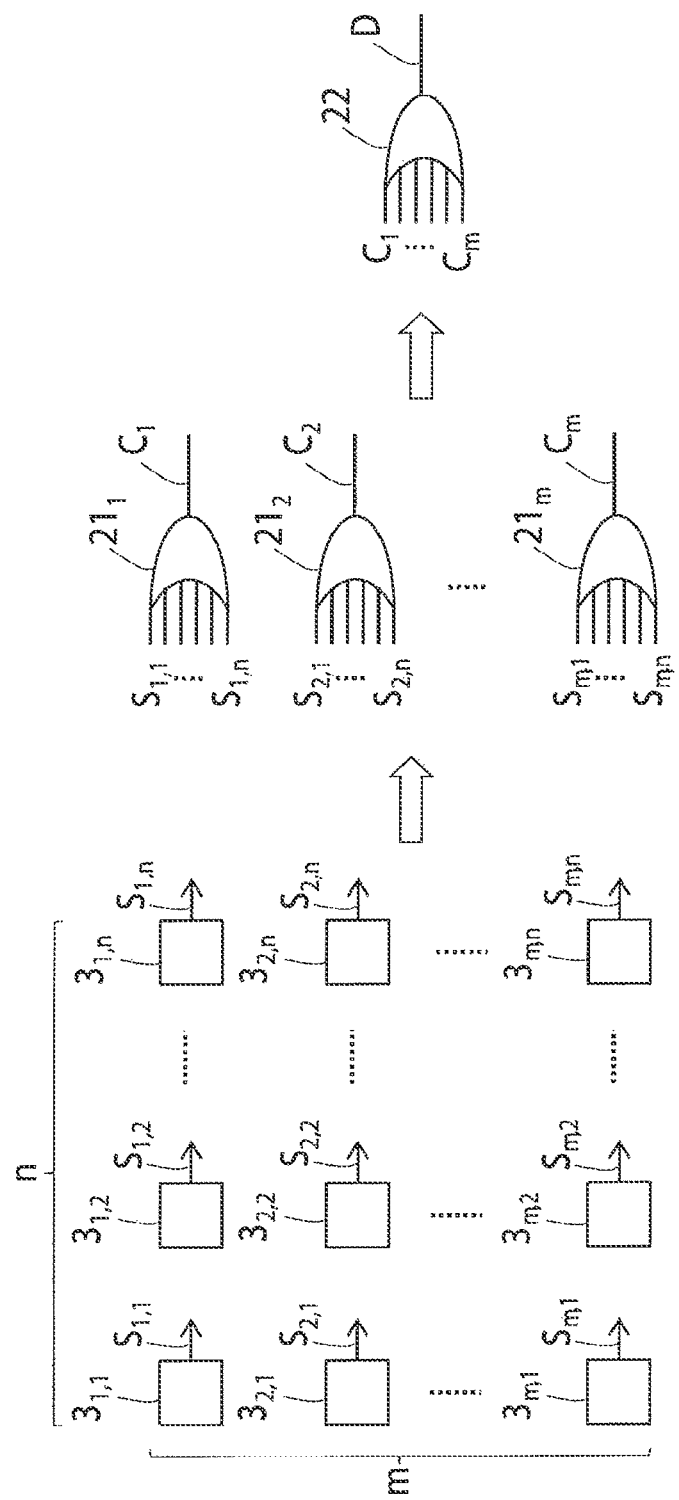
FIG. 5 is a schematic diagram for explaining a method of using outputs of comparing circuits of the present embodiment.

FIG. 5 is a schematic diagram for explaining a method of using the outputs of the comparing circuits 7 of the present embodiment.

The BAA apparatus 204 of the present embodiment includes the same number of comparing circuits 7 as that of the apertures 3, and each comparing circuit 7 corresponds to one aperture 3. In FIG. 5, these apertures 3 are distinguished with suffixes like signs $3_{1,1}, 3_{1,2}, \ldots 3_{1,n}, \ldots 3_{m,n}$. Likewise, the comparison result signals S from the comparing circuits 7 for these apertures 3 are distinguished with suffixes like signs $S_{1,1}, S_{1,2}, \ldots S_{1,n}, \ldots S_{m,n}$.

The BAA apparatus 204 further includes m first compressing circuits $21_1$ to $21_m$, and one second compressing circuit 22. The first compressing circuits $21_1$ to $21_m$ and the second compressing circuit 22 are an example of a compressor. FIG. 5 further shows compression result signals $C_1$ to $C_m$ output from the first compressing circuits $21_1$ to $21_m$, and a compression result signal D output from the second compressing circuit 22. When the first compressing circuits $21_1$ to $21_m$ are not needed to be distinguished or the compression result signals $C_1$ to $C_m$ are not needed to be distinguished, they are expressed as the first compressing circuits 21 or the compression result signals C (the same holds true for other suffixed signs).

Since the comparing circuits 7 exist for the respective apertures 3, tens of thousands of comparing circuits 7 are to be provided in the BAA apparatus 204 that is going to be developed hereafter. However, since the number of external terminals of the BAA apparatus 204 is restricted, it is difficult to output all the comparison result signals S to the outside.

In order to reduce the number of external terminals for the comparing circuits 7, it is sufficient to compress and output the comparison result signals S in units of predetermined blocks. For example, when the comparing circuits 7 are XOR (exclusive OR) gates, a plurality of comparison result signals S for each block are input to an OR (logical sum) gate, and one compression result signal C is output from the OR gate, so that these comparison result signals S can be compressed into one compression result signal C.

In this case, when all the logic levels of these comparison result signals S are "logical 0", the logic level of the compression result signal C becomes "logical 0", and it becomes clear that this block does not contain any failure electrode 6a. On the other hand, even when only one of the logic levels of these comparison result signals S is "logical 1", the logic level of the compression result signal C becomes "logical 1", and it becomes clear that this block contains a failure electrode 6a. When each block contains K (K is an integer not less than two) comparing circuits 7, the number of external terminals for the comparing circuits 7 can be reduced to 1/K by the compression (details of each block are mentioned later).

Therefore, the first compressing circuit $21_1$ calculates a logical sum of n comparison result signals $S_{1,1}$ to $S_{1,n}$, and outputs the calculation result of this logical sum as the compression result signal $C_1$. Likewise, each of the first compressing circuits $21_2$ to $21_m$ calculates a logical sum of corresponding n comparison result signals S, and outputs the calculation result of this logical sum as each of the compression result signals $C_2$ to $C_m$. Each of the first compressing circuits $21_1$ to $21_m$ is an example of a compressor that compresses the comparison result signals from the comparison circuitries. Here, each compressor compresses the comparison result signals S from m comparison circuitries into the compression result signal C.

Furthermore, the second compressing circuit 22 calculates a logical sum of m compression result signals $C_1$ to $C_m$, and outputs the calculation result of this logical sum as the compression result signal D. In this way, the number of external terminals for the comparing circuits 7 can be reduced to one. In this case, when all the logic levels of m×n comparison result signals S are "logical 0", the logic level of the compression result signal D becomes "logical 0", and it becomes clear that the BAA apparatus 204 does not contain any failure electrodes 6a. On the other hand, even when only one of the logic levels of the m×n comparison result signals S is "logical 1", the logic level of the compression result signal D becomes "logical 1", and it becomes clear that the BAA apparatus 204 contain a failure electrode 6a. A combination of the first compressing circuits $21_1$ to $21_m$ and the second compressing circuit 22 is also an example of a compressor that compresses the comparison result signal from the comparison circuitries. Here, this compressor compresses the comparison result signals S from m×n comparison circuitries into the compression result signal D.

The blocks into which the m×n comparing circuits 7 are divided may be set in a different manner from that in FIG. 5. For example, vertical m comparing circuits 7 may be set as one block in place of horizontal n comparing circuits 7 set as one block as in FIG. 5.

The above electrode test is performed, for example, using a tester in order to detect a defective article in the shipping stage of BAA apparatuses 204. In this case, the compression result signal D is output to the tester, and the tester determines whether or not a BAA apparatus 204 is defective.

On the other hand, when this electrode test is performed in the state where the BAA apparatus 204 is contained inside the EB lithography apparatus 100, the compression result signal D is input to a port input or an interrupt input of the EB lithography apparatus 100. In this way, in the EB lithography operation state, the EB lithography apparatus 100 (controlling calculator 121) can be caused to recognize that a failure of the electrode 6a arises due to electrode peeling-off or the like.

While on the EB lithography apparatus 100, the BAA apparatus 204 that does not have any failure electrodes 6a is typically mounted, a failure of the electrode 6a of the BAA apparatus 204 sometimes arises during EB lithography due to electrode peeling-off or the like. Conventionally, in this case, the EB lithography apparatus 100 is stopped to investigate the cause when a pattern error arises in a lithographed mask. Since there exist many kinds of cause of the pattern error, there is a concern that the stop due to the pattern error significantly causes deterioration of the operation rate of the EB lithography apparatus 100.

On the other hand, in the EB lithography operation state of the present embodiment, the driving circuit 2 outputs the driving signal on each occasion, and when electrode peeling-off arises, the comparing circuit 7 corresponding to the failure electrode 6a outputs the comparison result signal S of "logical 1", In this case, since the second compressing circuit 22 outputs the compression result signal D of "logical 1", the EB lithography apparatus 100 can recognize that the failure of the electrode 6a of the BAA apparatus 204 arises, from the compression result signal D.

Then, upon reception of the compression result signal D of "logical 1", the EB lithography apparatus 100 of the present embodiment stops lithography operation of the EB lithography apparatus 100 at the stage of the failure of the electrode 6a arising, by outputting a warning or an error. In this case, since it is clear that the cause of the stop of the lithography operation is in the BAA apparatus 204, deterioration of the operation rate of the EB lithography apparatus 100 can be suppressed to the minimum by changing the BAA apparatus 204 and resuming the lithography operation.

Figure 6:
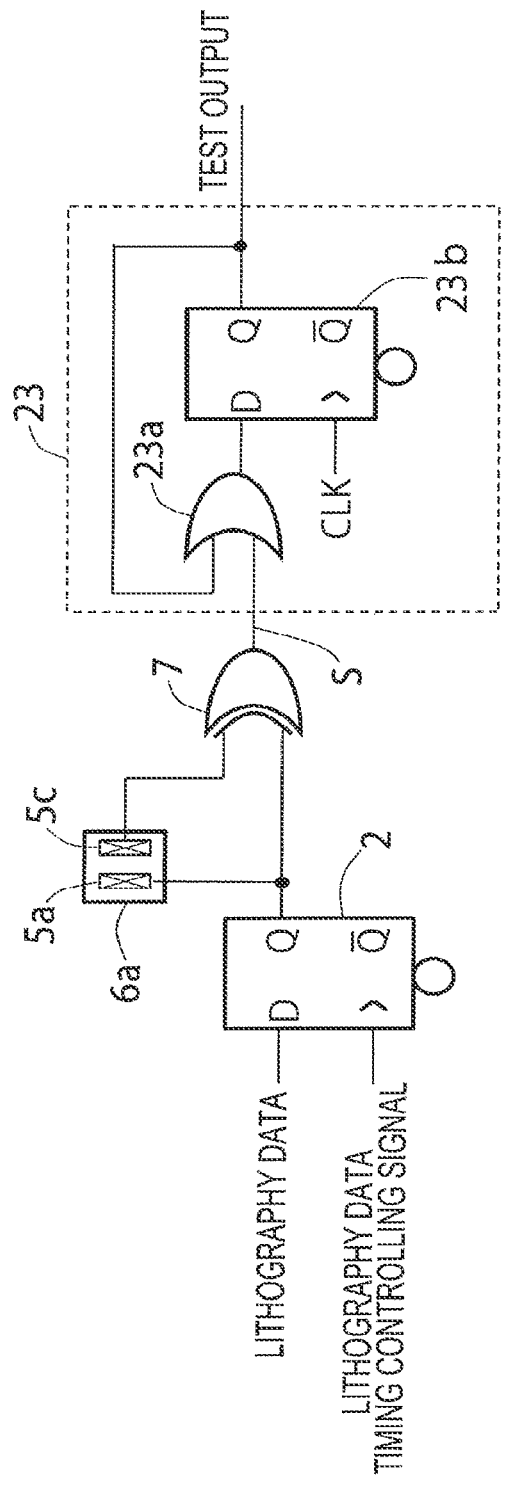
FIG. 6 is a circuit diagram showing a first example of a test outputting circuit of the present embodiment.

FIG. 6 is a circuit diagram showing a first example of a test outputting circuit of the present embodiment.

In FIG. 6, the BAA apparatus 204 includes a flip-flop circuit 2 as the driving circuit, includes an XOR gate as the comparing circuit 7, and includes a test outputting circuit 23 downstream of the comparing circuit 7. The test outputting circuit 23 includes an OR gate 23a and a flip-flop circuit 23b.

In FIG. 6, the flip-flop circuit 2 is supposed to be able to directly drive an electrode voltage. Nevertheless, when the electrode voltage is higher than the voltage of the logic circuit, it is desirable that a level converting circuit is inserted between the flip-flop circuit 2 and the via plug 5a to convert, as to the voltage level of the driving signal, from the voltage of the logic circuit to the electrode voltage and that a level converting circuit to which the electrode voltage can be input and from which the voltage level of the logic circuit can be output is inserted between the via plug 5c and the XOR gate 7.

The comparing circuit 7 compares the logic level of the driving signal from the driving circuit 2 and the logic level of the signal from the via plug 5c. In this stage, since change of the logic level of the signal from the via plug 5c is delayed from change of the logic level of the driving signal, a whisker-like pulse caused by a phase difference between these signals appears in the comparison result signal S from the comparing circuit 7. When the comparison result signals S are compressed as they are, this pulse is reflected also in the compression result signal D.

Therefore, in the case where such a whisker-like pulse is problematic when inputting the compression result signal D to the EB lithography apparatus 100 to monitor electrode peeling-off, it is desirable to mask the whisker-like pulse of the comparison result signal S by a flip-flop circuit or to mask the whisker-like pulse with a signal for controlling operation timing of the driving circuit 2 or the similar signal. The test outputting circuit 23 is provided for the former masking (a test outputting circuit 24 mentioned later is provided for the latter masking). Operation of the test outputting circuit 23 is described with reference to FIGS. 7A to 7G.

FIGS. 7A to 7G show a timing chart for explaining operation in the first example of the test outputting circuit of the present embodiment.

Figure 7:
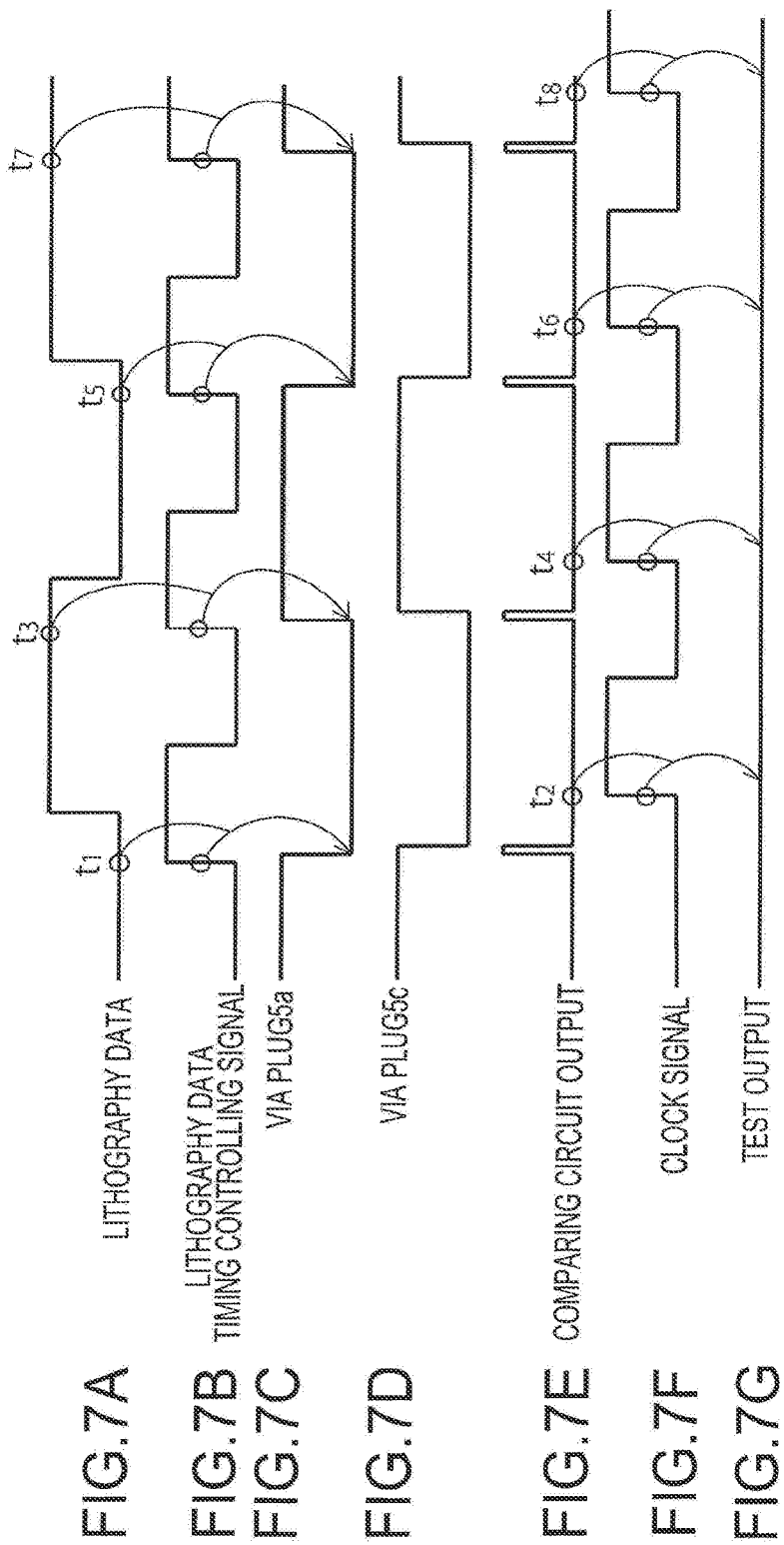
FIGS. 7A to 7G show a timing chart for explaining operation in the first example of the test outputting circuit of the present embodiment.

FIG. 7A shows lithography data input to the driving circuit 2, and FIG. 7B shows a lithography data timing controlling signal input to the driving circuit 2. Moreover, FIG. 7C shows change of a signal measured at the via plug 5a, and FIG. 7D shows change of a signal measured at the via plug 5c.

Timing when the driving circuit 2 takes in the lithography data is defined by rising of the lithography data timing controlling signal. Times $t_1$, $t_3$, $t_5$ and $t_7$ indicate times when the lithography data timing controlling signal rises. The driving circuit 2 outputs the driving signal in accordance with the lithography data and the lithography data timing controlling signal, and as a result, the signal in FIG. 7C is measured at the via plug 5*a*. Furthermore, the signal in FIG. 7D is measured at the via plug 5*c*. It should be noted that the change of the logic level of the signal in FIG. 7D is delayed from the change of the logic level of the signal in FIG. 7C.

To the comparing circuit 7, the driving signal from the driving circuit 2 and the signal from the via plug 5*c* are input. In this stage, as understood from FIG. 7C and FIG. 7D, since the change of the logic level of the signal from the via plug 5*c* is delayed from the change of the logic level of the driving signal, whisker-like pulses caused by the phase difference between these signals appear in the comparison result signal S from the comparing circuit 7 (FIG. 7E).

Here, to the flip-flop circuit 23*b*, an output signal from the OR gate 23*a* and a clock signal (CLK) shown in FIG. 7F are input. Further, to the OR gate 23*a*, the comparison result signal S from the comparing circuit 7 and the output signal from the flip-flop circuit 23*b* are input. Furthermore, timing when the flip-flop circuit 23*b* takes in the output signal from the OR gate 23*a* is defined by rising of the clock signal. Times $t_2$, $t_4$, $t_6$ and $t_8$ indicate times when the clock signal rises.

As shown in FIG. 7F, the clock signal rises at times $t_2$, $t_4$, $t_6$ and $t_8$ which are sufficiently delayed from times $t_1$, $t_3$, $t_5$ and $t_7$, respectively. Specifically, times $t_2$, $t_4$, $t_6$ and $t_8$ are delayed from times $t_1$, $t_3$, $t_5$ and $t_7$, respectively, by a longer time than the pulse width of the whisker-like pulse. Hence, the flip-flop circuit 23*b* can take in the output signal from the OR gate 23*a* in timing when it is not influenced by the whisker-like pulses. Therefore, the flip-flop circuit 23*b* can output the comparison result signal S from which the whisker-like pulses are removed as a test output signal (FIG. 7G), The test output signal is input to any of the first compressing circuits 21 in FIG. 5.

To the flip-flop circuit 23*b*, the OR calculation result of the comparison result signal S and this test output signal, not the comparison result signal S itself, is input. Therefore, once the logic level of the test output signal is changed to "logical 1", the logic level of the test output signal is continuously "logical 1" afterward. In this way, the tester detecting the compression result signal D or the controlling calculator 121 can securely detect failure occurrence in the BAA apparatus 204.

Figure 8:
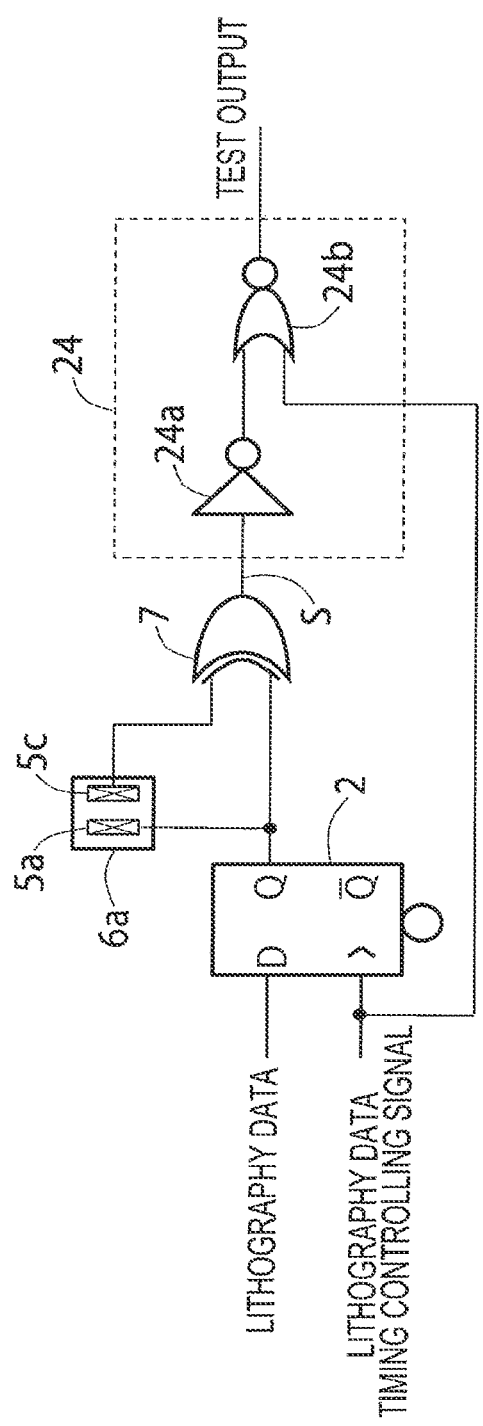
FIG. 8 is a circuit diagram showing a second example of the test outputting circuit of the present embodiment.

FIG. 8 is a circuit diagram showing a second example of the test outputting circuit of the present embodiment.

In FIG. 8, the BAA apparatus 204 includes a flip-flop circuit as the driving circuit 2, includes an XOR gate as the comparing circuit 7, and includes a test outputting circuit 24 downstream of the comparing circuit 7. The test outputting circuit 24 includes a NOT gate 24*a* and a NOR gate 24*b*.

Similarly to the aforementioned test outputting circuit 23, the test outputting circuit 24 is provided for masking whisker-like pulses of the comparison result signal S. Operation of the test outputting circuit 24 is described with reference to FIGS. 9A to 9F.

FIGS. 9A to 9F show a timing chart for explaining operation in the second example of the test outputting circuit of the present embodiment.

FIG. 9A shows lithography data input to the driving circuit 2, and FIG. 9B shows a lithography data timing controlling signal input to the driving circuit 2. Moreover, FIG. 9C shows change of a signal measured at the via plug 5*a*, and FIG. 9D shows change of a signal measured at the via plug 5*c*. FIG. 9E shows the comparison result signal S output from the comparing circuit 7. The characteristics of the signals in FIG. 9A to FIG. 9E are the same as those of the signals in FIG. 7A to FIG. 7E.

Here, to the NOT gate 24*a*, the comparison result signal S in FIG. 9E is input. Furthermore, to the NOR gate 24*b*, the output signal from the NOT gate 24*a* and the lithography data timing controlling signal in FIG. 9B are input. Then, the test outputting circuit 24 outputs the output signal from the NOR gate 24*b* is output as the test output signal (FIG. 9F).

The NOR gate 24*b* outputs the NOR calculation result of the output signal from the NOT gate 24*a* and the lithography data timing controlling signal as the test output signal. Therefore, only when the lithography data timing controlling signal in FIG. 9B is "logical 0" and the comparison result signal S in FIG. 9E is "logical 1", the test output signal in FIG. 9F becomes "logical 1". Here, when a whisker-like pulse arises in the comparison result signal S, the comparison result signal S becomes "logical 1". Timing when the whisker-like pulse arises is different from timing when the lithography data timing controlling signal is "logical 0" (see FIG. 9B and FIG. 9E). Therefore, the NOT gate 24*a* can output the comparison result signal S from which whisker-like pulses are removed as the test output signal (FIG. 9F). The test output signal is input to any of the first compressing circuits 21 in FIG. 5.

When the test outputting circuit 23 in the first example and the test outputting circuit 24 in the second example are compared, the test outputting circuit 24 in the second example has an advantage that it has a simpler configuration than the test outputting circuit 23 in the first example. On the other hand, the test outputting circuit 23 in the first example has an advantage that failure occurrence in the BAA apparatus 204 can be securely detected since once the logic level of the test output signal is changed to "logical 1", the logic level of the test output signal is continuously "logical 1" afterward.

Next, referring to FIGS. 3A and 3B again, a scanning test of the BAA apparatus 204 by a scanning test circuit is described.

When it is wanted to know in which aperture 3 of the BAA apparatus 204 the electrode 6*a* has a failure for failure analysis or analysis to improve yields, a scanning test circuit may be used for the BAA apparatus 204.

The driving circuit 2 includes a flip-flop (F/F) circuit, for example, for receiving lithography data from the controlling circuit 1 at certain cycles and holding the value of the lithography data during the same cycle. The driving circuits 2 shown in FIG. 6 and FIG. 8 exemplarily include this. In this case, in order to make the test of the BAA apparatus 204 easy, the F/F circuit of the driving circuit 2 may be replaced by a scanning F/F circuit for the scanning test.

In the scanning test, shift-in operation is performed for setting the state to be tested to all the F/F circuits. Furthermore, capturing operation is performed in which the shifted-in data is caused to operate in a normal operation state to take the test results into the F/F circuits. Furthermore, scanning-out operation is performed in which the outputs of the F/F circuits are shifted for every cycle and output from a scanning-out terminal to compare these outputs with an expectation value. In the scanning test, the BAA apparatus 204 is tested through these operations.

In order to determine in which aperture 3 the electrode 6*a* has a failure, a test mode of capturing the comparison result signals S from the comparing circuits 7 into the scanning F/F circuits may be provided in the BAA apparatus 204. After inputting a test pattern for an electrode test from the driving circuits 2 to the comparing circuits 7, the capturing operation allows the comparison result signal S to be taken in the scanning F/F circuits, and after that, the shift-out operation is performed. Thereby, all the comparison result signals S can be output from the scanning-out terminal for every cycle.

As to the scanning F/F circuits, the order of their outputs in shift-out are predetermined in accordance with the way of connection of those in the scanning chain. Therefore, by finding at which place in the shift-out operations the comparison result signal S becomes "logical 1", in which aperture 3 the electrode 6a has a failure can be determined. The failure in the electrodes 6a can be pinpointed, and thereby, yields in the MEMS manufacturing process can be improved, and effective failure analysis in electrode failure occurrence can be realized.

As described above, the BAA apparatus 204 of the present embodiment includes the comparing circuit 7 which compares the logic level of the driving signal and the logic level of the signal obtained from the via plug 5c to output the comparison result signal S indicating the result of this comparison. Therefore, according to the present embodiment, even in the case of many electrodes 6a of the BAA apparatus 204, the electrodes 6a can be easily tested.

Moreover, the BAA apparatus 204 of the present embodiment includes the first compressing circuits $21_1$ to $21_m$ which compress, under division of the apertures into a plurality of blocks, a plurality of comparison result signals S are compressed for each block to output the compression result signals $C_1$ to $C_m$ indicating the results of this compression, and the second compressing circuit 22 which compresses these compression result signals $C_1$ to $C_m$ to output the compression result signal D indicating the result of this compression. Therefore, according to the present embodiment, the number of signals output from the BAA apparatus 204 can be reduced, and even in the case of few external terminals of the BAA apparatus 204, the comparison results (compression result) can be output from the BAA apparatus 204.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A blanking aperture array apparatus comprising:
a plurality of apertures arranged into an array, each of which being provided to blank a plurality of charged particle beams; and
first electrodes, second electrodes, first via plugs, second via plugs, drivers and comparison circuitries that are provided for each of the plurality of apertures,
wherein
a first electrode performs blanking control,
a second electrode is opposite to the first electrode and connected to a ground,
a first via plug is electrically connected to the first electrode,
a second via plug is electrically connected to the first electrode,
a driver supplies a driving signal that drives the first electrode to the first electrode via the first via plug, and
a comparison circuitry is provided to correspond to the first electrode and compares the driving signal and a signal obtained from the second via plug to output a comparison result signal indicating a result of the comparison.

2. The apparatus of claim 1, further comprising a compressor that compresses, under division of the plurality of apertures into a plurality of blocks, outputs of comparison result signals from the comparison circuitries for each block, and outputs a compression result signal indicating a result of the compression.

3. The apparatus of claim 1, further comprising:
a first compressor that compresses, under division of the plurality of apertures into a plurality of blocks, outputs of comparison result signals from the comparison circuitries for each block, and outputs a first compression result signal indicating a result of the compression; and
a second compressor that compresses the first compression result signals for the plurality of blocks, and outputs a second compression result signal indicating a result of the compression.

4. The apparatus of claim 1, wherein the comparison result signal indicates a calculation result of an exclusive OR of a logic level of the driving signal and a logic level of the signal obtained from the second via plug.

5. The apparatus of claim 1, wherein the driver masks a predetermined pulse of the comparison result signal caused by phase difference between the driving signal and the signal obtained from the second via plug.

6. A charged particle beam lithography apparatus comprising:
a plurality of apertures arranged into an array, each of which being provided to blank a plurality of charged particle beams; and
first electrodes, second electrodes, first via plugs, second via plugs, drivers and comparison circuitries that are provided for each of the plurality of apertures,
wherein
a first electrode performs blanking control,
a second electrode is opposite to the first electrode and connected to a ground,
a first via plug is electrically connected to the first electrode,
a second via plug is electrically connected to the first electrode,
a driver supplies a driving signal that drives the first electrode to the first electrode via the first via plug,
a comparison circuitry is provided to correspond to the first electrode and compares the driving signal and a signal obtained from the second via plug to output a comparison result signal indicating a result of the comparison, and
the apparatus further comprises a controller that controls lithography with the charged particle beams based on the comparison result signal.

7. The apparatus of claim 6, further comprising a compressor that compresses, under division of the plurality of apertures into a plurality of blocks, outputs of comparison result signals from the comparison circuitries for each block, and outputs a compression result signal indicating a result of the compression.

8. The apparatus of claim 6, further comprising:
a first compressor that compresses, under division of the plurality of apertures into a plurality of blocks, outputs of comparison result signals from the comparison circuitries for each block, and outputs a first compression result signal indicating a result of the compression; and a second compressor that compresses the first compression result signals for the plurality of blocks, and outputs a second compression result signal indicating a result of the compression.

9. The apparatus of claim 6, wherein the comparison result signal indicates a calculation result of an exclusive OR of a logic level of the driving signal and a logic level of the signal obtained from the second via plug.

10. The apparatus of claim 6, wherein the driver masks a predetermined pulse of the comparison result signal caused by phase difference between the driving signal and the signal obtained from the second via plug.

11. An electrode testing method for a blanking aperture array apparatus that comprises a plurality of apertures arranged into an array, each of which being provided to blank a plurality of charged particle beams, and first electrodes, second electrodes, first via plugs, second via plugs, drivers and comparison circuitries that are provided for each of the plurality of apertures, the method comprising:

supplying a driving signal that drives a first electrode from a driver to the first electrode via a first via plug that is electrically connected to the first electrode;

comparing, by a comparison circuitry provided to correspond to the first electrode, the driving signal and a signal obtained from a second via plug that is electrically connected to the first electrode to output a comparison result signal indicating a result of the comparison; and determining whether the blanking aperture array apparatus is defective based on the comparison result signal.

12. The method of claim 11, wherein the comparison result signal indicates a calculation result of an exclusive OR of a logic level of the driving signal and a logic level of the signal obtained from the second via plug.

13. The method of claim 11, wherein the method is performed without mounting the blanking aperture array apparatus on a charged particle beam lithography apparatus.

* * * * *